US006793501B1

(12) United States Patent
Leeman et al.

(10) Patent No.: US 6,793,501 B1
(45) Date of Patent: Sep. 21, 2004

(54) ELECTRIC COMPONENTS FOR PRINTED BOARDS AND METHOD FOR AUTOMATICALLY INSERTING SAID COMPONENTS IN PRINTED BOARDS

(75) Inventors: Reginald Leeman, Oostende (BE);
Bernard Houteman, Oostkamp (BE);
Georges Embo, Langemark (BE);
Edgard Acke, Oostkamp (BE)

(73) Assignee: Tyco Electronics Logistics AG, Steinach (CH)

( * ) Notice: Subject to any disclaimer, the term of this patent is extended or adjusted under 35 U.S.C. 154(b) by 0 days.

(21) Appl. No.: 09/831,415

(22) PCT Filed: Nov. 2, 1999

(86) PCT No.: PCT/DE99/03493

§ 371 (c)(1),
(2), (4) Date: Sep. 14, 2001

(87) PCT Pub. No.: WO00/28627

PCT Pub. Date: May 18, 2000

(30) Foreign Application Priority Data

Nov. 10, 1998 (DE) .......................................... 198 51 868

(51) Int. Cl.[7] .............................................. H01R 12/00
(52) U.S. Cl. ........................................ 439/63; 439/876
(58) Field of Search ............................. 439/79, 63, 83, 439/876

(56) References Cited

U.S. PATENT DOCUMENTS

| 4,826,442 A | 5/1989 | Douty et al. |
| 5,073,119 A | 12/1991 | Soes |
| 5,141,445 A | 8/1992 | Little |
| 5,169,343 A | 12/1992 | Andrews |
| 5,394,609 A | 3/1995 | Ferguson et al. |
| 5,616,035 A | 4/1997 | Shu |

FOREIGN PATENT DOCUMENTS

| DE | 3738545 | 5/1989 |
| DE | 4337408 | 5/1995 |
| DE | 19716139 | 6/1998 |
| EP | 0488482 | 6/1992 |
| EP | 0582960 | 2/1994 |
| GB | 2176950 | 1/1987 |
| GB | 2214729 | 6/1989 |
| GB | 2303258 | 2/1997 |

*Primary Examiner*—Khiem Nguyen
(74) *Attorney, Agent, or Firm*—Baker & Daniels

(57) ABSTRACT

An electric circuit board component, in particular a RF coaxial connector, in which the housing (1) of the component is fixed on the circuit board (7) by way of solder joints between the SMD solder connections provided on the bottom side (6) of said housing and solder connections assigned thereto on the side of the circuit board, and in which the housing (1), for additionally securing the same to the circuit board (7), has on the bottom side (6) thereof a plurality of solderable bolt pins (11) which engage in continuous plated bolt holes (12) assigned thereto on the circuit board (7) and are soldered in said bolt holes.

9 Claims, 2 Drawing Sheets

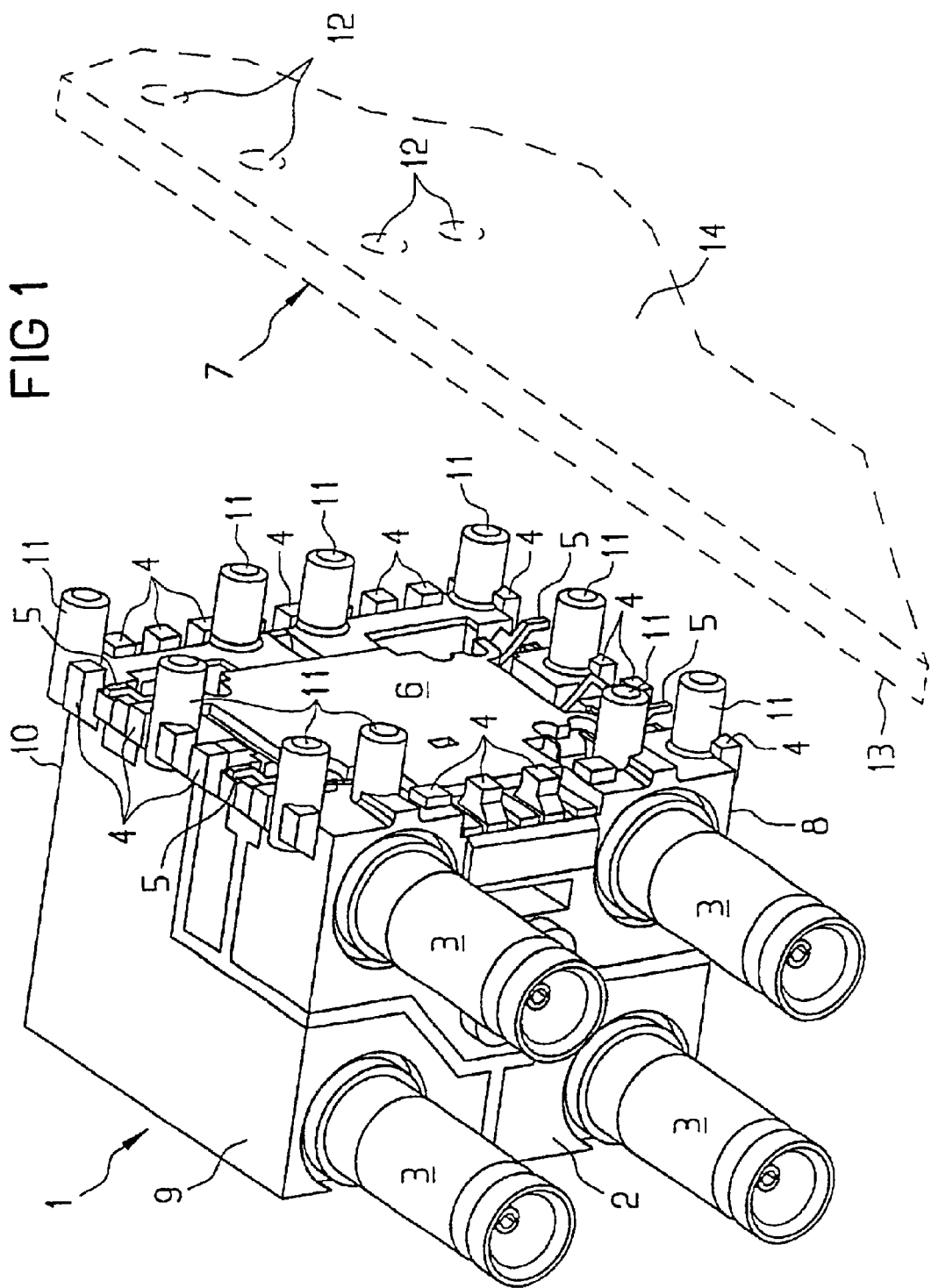

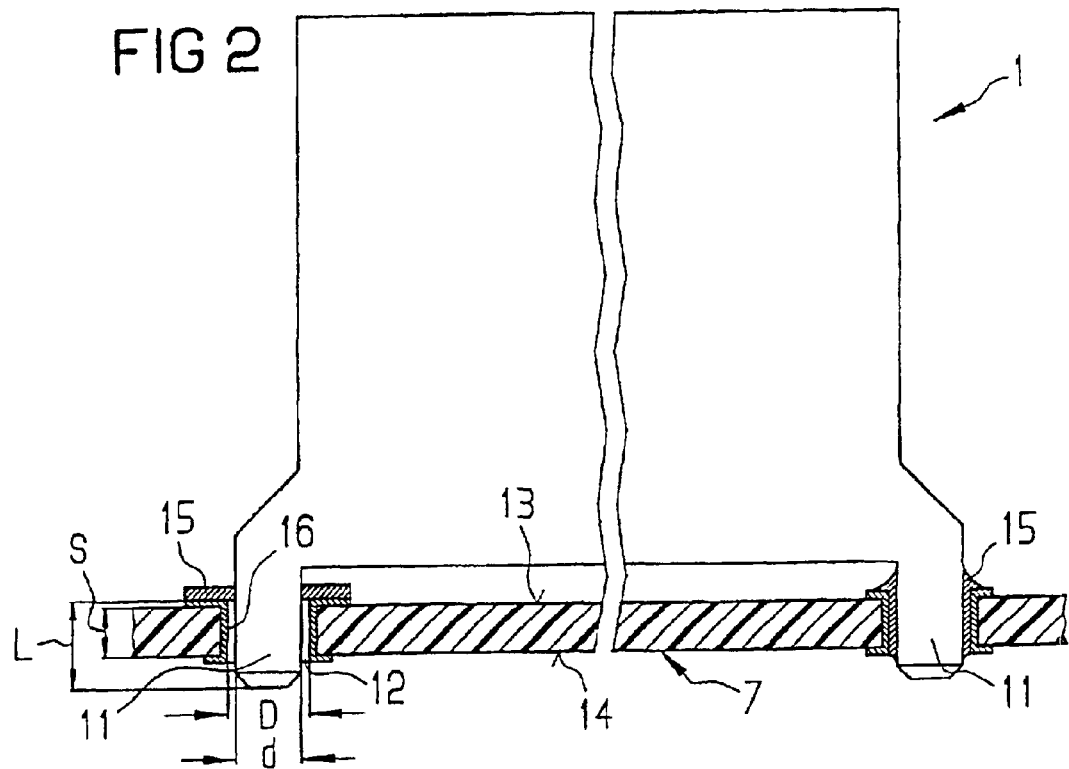
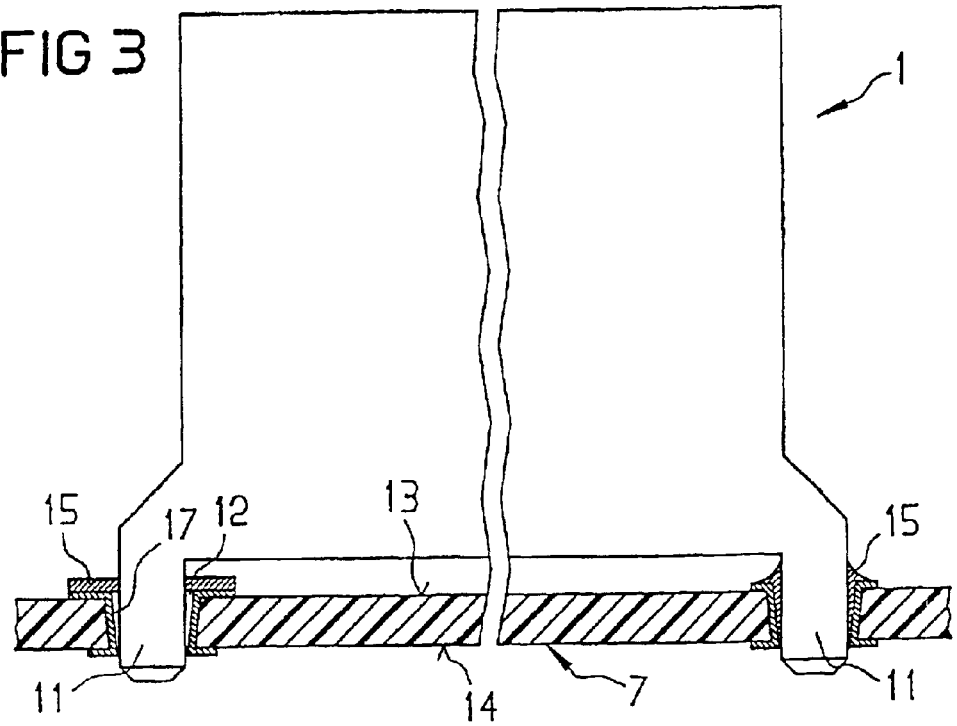

ELECTRIC COMPONENTS FOR PRINTED BOARDS AND METHOD FOR AUTOMATICALLY INSERTING SAID COMPONENTS IN PRINTED BOARDS

The invention relates to an electric circuit board component, in particular an RF coaxial connector, in which the housing of the component is secured on the circuit board by way of solder joints between the SMD solder connections provided on the bottom side of said housing and solder connections assigned thereto on the circuit board.

Electric circuit board components, in particular RF coaxial connectors, are frequently employed in electric transmission and connection means. Basically, there are employed three different connection types for the electrical connection between the mutually associated terminals on the side of the component and on the side of the circuit board.

In the connection type—first connection type—as employed e.g. in the connector known from document EP 0 582 960 A1, there are used pressing pins, whereby a soldering operation can be dispensed with. However, the utilization of such relatively voluminous pressing pins presupposes that the number thereof per component be limited in consideration of the as small as possible dimensions of such components. However, the number thereof per component is also limited considerably in that the pressing force to be applied in urging the pressing pins on the component side into the associated plated connecting holes on the circuit board side must not exceed a value given by the strength of the component. For, the pressing force to be applied is proportional to the number of pressing pins provided. The automatic provision of circuit boards with such components requires very expensive devices.

In the connection type—second connection type—as employed for example with the connector known from document EP 0 488 482 A1, the terminals consist of solder pins made of thin wires. Such solder pins may also be employed in relatively large numbers for components of quite small dimensions. However, such connectors upon co mounting thereof must be applied manually to the circuit board, as it is difficult to introduce the thin solder pins into their associated connecting holes in the circuit board. Upon application of such connectors on the circuit board, soldering of the solder pins in their associated connecting holes in the circuit board takes place by flow soldering.

In case of the connection type—third connection type—as utilized e.g. for the connector known from document DE 197 16 139 C1, so-called SMD (surface mounted device) solder connections are employed for establishing the electrical connections between component and circuit board. The provision of the circuit boards with components having SMD solder connections, in contrast to those having pressing pins or solder pins, has the great advantage that it can be carried out simply and rapidly by means of automatic "pick & place" machines. The disadvantage thereof is the low anchoring strength of the component on the circuit board established by these soldering joints. For this reason, the component must be additionally secured to the circuit board by means of bolts or rivets, so as to prevent damaging or even tearing off of the SMD solder joints due to occasionally unavoidable higher mechanical loads.

It is the object of the invention to indicate a further solution for sufficiently securing electric components having SMD solder connections to circuit boards, which does not require screws or rivets and is particularly simple in terms of production technology.

According to the invention, this object is met for such an electric circuit board component in that the housing, for additionally securing the same to the circuit board, has on the bottom side thereof a plurality of solderable bolt pins which engage in continuous plated bolt holes assigned thereto on the circuit board and are soldered in said bolt holes.

The invention is based on the finding that the loading of circuit boards with the aid of automatic pick & place machines is also possible if the component has solder-pin-like connecting elements which are soldered in the circuit board in associated continuous plated holes. The sole prerequisite in this regard is that their cross-sectional area is sufficiently large to allow utilization thereof as centering means by the automatic pick & place machines upon application of the component to the circuit board.

Expedient developments of the subject matter according to claim 1 are indicated in the additional claims 2 to 8.

A further development is indicated in claims 9 and 10 in the form of method of automatically providing circuit boards with circuit board components making use of the invention, with said method being particularly advantageous in terms of time and costs.

The invention will be elucidated in more detail hereinafter by way of an embodiment shown in the drawings wherein FIG. 1 shows a perspective view of an embodiment in the form of an RF angular connector, FIG. 2 shows a schematic view of the anchoring of bolt pins on the housing in bolt holes in the circuit board according to a first embodiment, FIG. 3 shows a schematic view of the anchoring of bolt pins on the housing in bolt holes in the circuit board according to a second embodiment.

The first embodiment of an electric circuit board component illustrated in FIG. 1 is an RF angular connector. The basic structure thereof corresponds to the connector already known from the initially indicated document DE 197 16 139 C1. For this reason, it should be sufficient to deal with the structure of the constructional shape of this first embodiment only in so far as it is necessary for the understanding of the invention and, as for the rest, to make reference to the document mentioned as regards closer details thereof.

The housing 1, which may also be a metal housing, in the instant case consists of metallized plastics material. On the mating plug side 2 thereof, it has four coaxial sockets 3 in a row and column arrangement. The layer thickness of the metallization of housing 1 is at least equal to the depth of penetration of the electromagnetic waves to be transmitted via the circuit board component.

Housing 1 has contacting feet 4 and 5, of which contacting feet 4 are arranged in a multiplicity on the outside of housing 1 near the bottom side 6 thereof. Contacting feet 4 have abutting areas designed as tinnable SMD solder terminals. Contacting feet 5 also are SMD solder terminals and consist of the ends of the metallic inner conductors exiting from the bottom side 6 and bent parallel to the latter. The contacting feet 4 and 5 serve for electrical connection of their SMD solder terminals to the associated solder terminals on circuit board 7 shown only schematically in FIG. 1 in broken lines.

The contacting feet 4 are provided in larger numbers on the outside of the side walls 8 and 9 and the back wall 10 of housing 1 and each have a comb-like structure. They have a shape of the kind of supporting webs and each slightly project with their SMD terminals beyond the bottom side 6 of housing 1. The same applies analogously to the contacting feet 5 of the inner conductor ends. Additional contacting feet 4 are provided at the edge of bottom side 6 on the mating plug side 2.

The arrangement of the contacting feet 4 and 5 on the outside of side walls 8 and 9 and back wall 10 as well as along the edge on bottom side 6 on the mating plug side 2 is important for soldering the SMD solder terminals or connections thereof to circuit board 7, since the circulating heat used in soldering can thus be fed well to the SMD solder terminals. In addition thereto, it is easily possible afterwards to inspect whether the solder joints are perfect. To ensure perfect solder joints for all SMD solder terminals upon connection of housing 1 to circuit board 7, it is advisable to provide for a planarity tolerance of <0.1 mm between all SMD terminals of the contacting feet 4 and 5.

The number of the entirety of contacting feet 4 provided, the SMD solder connections of which are electrically connected to the metallization of housing 1, is selected to be as large as possible in order to ensure as good as possible fixing of housing 1 on circuit board 7 after the SMD solder joints have been established. As shown in practical application, the fixing of the housing attainable by SMD solder joints, however, is poor also with a larger number of SMD solder joints, so that the mechanical load capacity to be demanded for such fixing cannot be ensured to a sufficient extent.

For sufficient mechanical securing of housing 1 on circuit board 7, there are provided several solderable bolt pins 11, as shown in FIG. 1, between contacting feet 4 as well as on the outsides of side walls 8 and 9 and back wall 10 and on the edge of bottom side 6 on the mating plug side 2; these bolt pins 11 project beyond contacting feet 4 and 5 and, upon application to circuit board 7, engage in associated contact-establishing or plated bolt holes 12 in circuit board 7 in which they are soldered. Like housing 1, the bolt pins 11 consist of plastics material. Like the contacting feet 4, they are formed on the housing walls in the manner of supporting webs and are metallized.

Soldering of the bolt pins 11 of the housing in the plated bolt holes 12 in the circuit board, as in case of soldering solder pins, can be effected by flow soldering in which circuit board 7 is passed with the bottom side 14 thereof across a flow soldering bath, with the housing 1 being arranged on the top side 13 of said circuit board. Thus, in this case it is necessary to carry out two soldering operations when circuit board 7 is provided with a housing 1.

A first soldering operation is necessary for establishing the electrical connections between the SMD solder terminals of contacting feet 4 and 5 of the housing and the solder terminals assigned thereto on circuit board 7. In this process, circuit board 7 having housing 1 arranged thereon is passed through an SMD soldering furnace. Thereafter, a second soldering operation has to be carried out using a flow soldering bath for soldering the bolt pins 11 of the housing to their associated plated bolt holes 12 in the circuit board. However, soldering of the bolt pins 11 on the housing in the associated plated bolt holes 12 in the circuit board may also be carried out in particularly advantageous manner in accordance with the SMD soldering method, so that only one soldering operation has to be carried out in securing a housing 1 to circuit board 7 This fact shall be dealt with in more detail hereinafter with reference to FIGS. 2 and 3.

FIGS. 2 and 3 schematically illustrate the course of the SMD soldering operation. Each of FIGS. 2 and 3 shows a housing 1 arranged on circuit board 7. Each of the housings 1 is shown with two bolt pins 11 only, one thereof being integrally formed on the left-hand side wall 8 and the other one thereof being integrally formed on the right-hand side wall 9. Both bolt pins 11 engage in their associated bolt holes 12 in circuit board 7. The central vertical subdivision of housing 1 and circuit board 7 into left-hand and right-hand halves is supposed to indicate the,SMD soldering operation. The plated bolt hole 12 in the circuit board, along with the bolt pin 11 of the housing engaging therein, in the left-hand half illustrates the condition prior to passage of the circuit board 7 along with the housing 1 arranged thereon through the SMD soldering furnace, whereas the right-hand half illustrates the condition after passage thereof through the SMD soldering furnace.

Before application of housing 1 to circuit board 7, all soldering connections or areas on the top side 13 of circuit board 7 must be provided with a soldering paste layer. To this end, a soldering paste mask is employed.

In the region of the bolt holes 12, soldering paste 15 is applied across the same. Upon passage through the SMD soldering furnace, the soldering paste has flown into the cavity between bolt pin 11 and the plated wall of bolt hole 12, as can be seen well in the right-hand half of FIGS. 2 and 3 each, whereby bolt pin 11 is firmly soldered in the bolt hole.

The difference between FIGS. 2 and 3 resides merely in the shape of the bolt holes 12. While the plated inner wall 15 of bolt holes 12 in FIG. 2 is of vertical design, the plated inner wall 17 of bolt holes 12 in FIG. 3 is of slightly conical design. This design may make sense occasionally to prevent that the liquified soldering paste 15, upon passage of the circuit board 7 through the SMD soldering furnace, partly drips down from the bottom side 14 of circuit board 7. However, with a vertical inner wall 16, this can be prevented in general by way of a suitable, mutually matched dimensioning of bolt pin and bolt hole diameter, even if bolt pins 11 are slightly conically tapering towards the free end thereof. In the embodiment depicted in the drawings, the dimensions provided for, with a thickness S of the circuit board 7 of 1.6 mm, were as follows:

bolt hole diameter D=2.3 mm bolt pin diameter d=1.8 mm bolt pin length L=2.2 mm

What is claimed is:

1. An electrical component for circuit board mounting, comprising a connector housing and surface mount solder connections provided on the bottom side of said housing, said surface mount solder connections functioning as SMD connections for interconnection of the housing to a surface of the circuit board by way of solder joints between solder connections assigned thereto on the circuit board, the housing further comprising a plurality of solderable bolt pins on the bottom side of the housing for additionally securing the housing to the circuit board, said bolt pins being profiled for engagement in continuous plated bolt holes assigned thereto on the circuit board and are soldered in said bolt holes.

2. An electric circuit board component according to claim 1, wherein the solder joints between the housing-side bolt pins and the bolt holes in the circuit board are in the form of surface mount solder joints.

3. An electric circuit board component according to claim 1, wherein the housing, inclusive of the bolt pins thereof, consists of plastic material, and in that at least the bolt pins are provided with a solderable metallization.

4. An electric circuit board component according to claim 3, wherein the metallized bolt pins are at reference potential.

5. An electric circuit board component according to claim 1, wherein the cross-sectional area of the bolt pins is selected to be considerably larger than the cross-sectional area of solder pins made of thin wires, as usually employed with such components.

6. An electric circuit board component according to claim 5, wherein the cross-sectional area of the bolt pins, is selected to be so large that the mechanical load carrying capacity of the secured state of the housing on the circuit board sufficiently fulfills the requirements to be met thereby.

7. An electric circuit board component according to claim 1, wherein the bolt pins projecting beyond the bottom side of housing constitute lugs preferably integrally formed on the lower edge of housing on the outsides of side walls and back wall thereof.

8. An electric circuit board component according to claim 1, wherein the plated inner wall of the bolt holes in the circuit board is of slightly conical design, and that the thus-designed bolt holes have their largest inside width on the side of circuit board where the housing-side bolt pins engage in the bolt holes.

9. A method of automatically providing circuit boards with electric circuit board components, where the components include a component housing and surface mount solder connections provided on the bottom side of said housing for interconnection of the housing to the circuit board, and a plurality of solderable bolt pins on the bottom side of the housing for additionally securing the housing to the circuit board, the method comprising the steps of:

providing all solder connections and all bolt holes on the circuit board with a layer of soldering paste;

picking up the housing by an automatic pick and place machine and applying the housing to the circuit board exploiting the centering possibilities established by the bolt pins on the housing and the bolt holes in the circuit board; and passing the circuit board along with the housing applied thereto through an SMD soldering furnace in which, in one operation, the housing-side SMD solder connections of the contacting feet are firmly soldered to the solder connections assigned thereto on the circuit board on the one hand, and the bolt pins on the housing are firmly soldered to the bolt holes assigned thereto on the circuit board on the other hand.

* * * * *